United States Patent
Kwon et al.

(10) Patent No.: US 9,657,408 B2
(45) Date of Patent: May 23, 2017

(54) APPARATUS FOR MANUFACTURING INGOT

(71) Applicants: Hyun Goo Kwon, Uiwang (KR); Yeo Kyun Yoon, Hwaseong (KR); Min Soo Son, seoul (KR)

(72) Inventors: Hyun Goo Kwon, Uiwang (KR); Yeo Kyun Yoon, Hwaseong (KR); Min Soo Son, seoul (KR)

(73) Assignee: TECHNOVALUE CO., LTD., Seoul (KR)

( * ) Notice: Subject to any disclaimer, the term of this patent is extended or adjusted under 35 U.S.C. 154(b) by 289 days.

(21) Appl. No.: 14/257,202

(22) Filed: Apr. 21, 2014

(65) Prior Publication Data

US 2015/0259823 A1 Sep. 17, 2015

(30) Foreign Application Priority Data

Mar. 14, 2014 (KR) ........................ 10-2014-0030657

(51) Int. Cl.
*C30B 15/14* (2006.01)
*C30B 15/00* (2006.01)
*C30B 15/12* (2006.01)
*C30B 29/06* (2006.01)

(52) U.S. Cl.
CPC ............ *C30B 15/002* (2013.01); *C30B 15/12* (2013.01); *C30B 15/14* (2013.01); *C30B 29/06* (2013.01); *Y10T 117/1052* (2015.01)

(58) Field of Classification Search
CPC .................................. C30B 15/12; C30B 15/14
See application file for complete search history.

(56) References Cited

U.S. PATENT DOCUMENTS

| | | |
|---|---|---|
| 5,087,321 A | 2/1992 | Kamio et al. |
| 5,087,429 A | 2/1992 | Kamio et al. |
| 5,139,750 A | 8/1992 | Shima et al. |
| 5,242,531 A | 9/1993 | Klingshirn et al. |
| 5,474,022 A | 12/1995 | Abe et al. |
| 5,720,810 A * | 2/1998 | Arai ........................ C30B 15/12 117/208 |
| 5,891,245 A | 4/1999 | Atami et al. |
| 6,277,192 B1 | 8/2001 | Altekruger et al. |
| 7,635,414 B2 | 12/2009 | Bender |
| 8,202,797 B2 * | 6/2012 | Chi ..................... H01L 21/6835 257/737 |
| 8,262,797 B1 | 9/2012 | Bender et al. |
| 2007/0062442 A1 * | 3/2007 | Cho ........................ C30B 15/14 117/217 |
| 2012/0000416 A1 * | 1/2012 | Wang ..................... C30B 15/14 117/217 |

(Continued)

OTHER PUBLICATIONS

"A new technique for controlling the dopant concentration in the double-crucible method," Naoki Ono et al, Journal of Crustal Growth 135 (1994) pp. 359-364, North-Holland.

*Primary Examiner* — Robert M Kunemund
(74) *Attorney, Agent, or Firm* — Patent Office of Dr. Chung Park (57) ABSTRACT

Disclosed is an ingot manufacturing apparatus that includes: an inner wall which has a growth zone where an ingot IG grows from molten silicon; a crucible which surrounds the inner wall; and a heat reflector which is formed convexly toward an interface between a surface of the molten silicon of the growth zone and the inner wall.

9 Claims, 10 Drawing Sheets

(56) References Cited

U.S. PATENT DOCUMENTS

2012/0060748 A1 3/2012 Corbeil et al.
2012/0266808 A1 10/2012 Luter et al.
2012/0279437 A1 11/2012 Johnson
2013/0133567 A1 5/2013 Bender

* cited by examiner

APPARATUS FOR MANUFACTURING INGOT

CROSS-REFERENCE TO PRIOR APPLICATIONS

This application claims priority of Korean Patent Application No. 10-2014-0030657, filed on Mar. 14, 2014, which is hereby incorporated by reference in its entirety.

BACKGROUND OF THE DISCLOSURE

Field of the Disclosure

The present invention relates to an ingot manufacturing apparatus.

Description of the Related Art

An ingot is important in the manufacture of a semiconductor chip or a solar cell. The ingot is manufactured during a process of melting and solidifying silicon in a crucible.

The ingot is manufactured by Czochralski method in which, while a rod or a seed crystal which has penetrated molten silicon is slowly lifted, the silicon attached in the vicinity of the rod or the seed crystal is solidified.

Recently, research is being devoted to an ingot manufacturing apparatus using a continuous Czochralski method capable of a plurality of ingots by continuously supplying the silicon.

SUMMARY

One embodiment is an ingot manufacturing apparatus that includes: an inner wall which has a growth zone where an ingot IG grows from molten silicon; a crucible which surrounds the inner wall; and a heat reflector which is formed convexly toward an interface between a surface of the molten silicon of the growth zone and the inner wall.

The ingot manufacturing apparatus may further include a heat shield which is disposed over the crucible, and a cone which is continuously formed with the heat shield and is disposed between the ingot and the inner wall. The heat reflector may be disposed on the cone.

An imaginary line formed by connecting a center of a radius of curvature of the heat reflector to the interface may pass through the heat reflector.

The radius of curvature may be smaller than a distance between the interface and the center.

The heat reflector may have a first end and a second end closer to the inner wall than the first end. When the imaginary line connects the center with the interface between the inner wall and the surface of the molten silicon having an initial height, an angle formed between the imaginary line and the surface of the molten silicon may be the same as or greater than an angle formed between a first imaginary auxiliary line which passes through the center and is parallel with the molten silicon and a second imaginary auxiliary line which passes through the center and the second end, and the angle formed between the imaginary line and the surface of the molten silicon may be less than an angle formed between the first imaginary auxiliary line and a third imaginary auxiliary line which passes through the center and the first end.

The surface of the heat reflector may be made of one of SiC, SiN, SiCN, SiBN, SicBN, ZrC, ZrN, ZrCN, ZrBN, ZrcBN, TiC, TiN, TiCN, TiBN, TicBN, tungsten carbide, molybdenum, tungsten, tantalum, or chrome.

Another embodiment is an ingot manufacturing apparatus that includes: an inner wall which has a growth zone where an ingot IG grows from molten silicon; a crucible which surrounds the inner wall; a heat shield which is disposed over the inner wall; and a heat reflector which is disposed beneath a bottom surface of the heat shield parallel with a surface of the molten silicon.

The ingot manufacturing apparatus may further include a cone which is continuously formed with the heat shield and has an end located between the ingot and the inner wall.

The thickness of the heat reflector may be increased or decreased toward the ingot.

The surface of the heat reflector may be made of one of SiC, SiN, SiCN, SiBN, SicBN, ZrC, ZrN, ZrCN, ZrBN, ZrcBN, TiC, TiN, TiCN, TiBN, TicBN, tungsten carbide, molybdenum, tungsten, tantalum, or chrome.

A reflective surface of the heat reflector may be flat.

Further another embodiment is an ingot manufacturing apparatus that includes: an inner wall which has a growth zone where an ingot IG grows from molten silicon; a crucible which surrounds the inner wall; a heat reflector which reflects heat of the molten silicon toward an interface between a surface of the molten silicon of the growth zone and the inner wall; and a gas nozzle which sprays sweeping gas toward a surface of the heat reflector.

The ingot manufacturing apparatus may further include a heat shield which is disposed over the inner wall, and a cone which is continuously formed with the heat shield and is disposed between the ingot and the inner wall. The heat reflector may be formed convexly toward the interface between the surface of the molten silicon of the growth zone and the inner wall. The gas nozzle may spray the sweeping gas moving through a flow path formed within the cone.

The flow path may be divided into a plurality of sub flow paths by partitions. The plurality of the sub flow paths may have substantially the same area as each other.

The ingot manufacturing apparatus may further include a heat shield which is disposed over the inner wall, and a cone which is continuously formed with the heat shield and is disposed between the ingot and the inner wall. The heat reflector may be disposed beneath a bottom surface of the heat shield parallel with the surface of the molten silicon. The gas nozzle may spray the sweeping gas moving through a flow path formed within the heat shield.

The flow path may be divided into a plurality of sub flow paths by partitions. The plurality of the sub flow paths may have substantially the same area as each other.

DETAILED DESCRIPTION OF EXEMPLARY EMBODIMENTS

Hereafter, an embodiment of the present invention will be described in detail with reference to accompanying drawings. However, the accompanied drawings are provided only for more easily describing the present invention. It is easily understood by those skilled in the art that the spirit and scope of the present invention is not limited to the scope of the accompanied drawings.

Terms used in the present specification are provided for description of only specific embodiments of the present invention, and not intended to be limiting. An expression of a singular form includes the expression of plural form thereof unless otherwise explicitly mentioned in the context.

In the present specification, it should be understood that the term "include" or "comprise" and the like is intended to specify characteristics, numbers, steps, operations, components, parts or any combination thereof which are mentioned in the specification, and intended not to previously exclude the possibility of existence or addition of at least one another characteristics, numbers, steps, operations, components, parts or any combination thereof.

Figure 1:
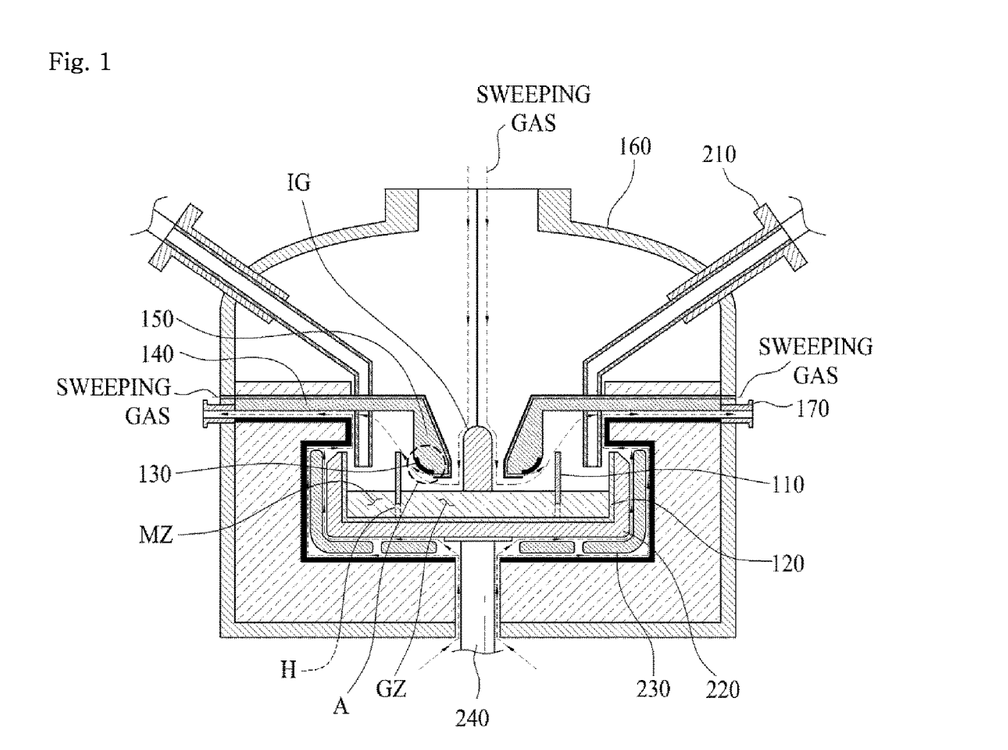
FIG. 1 shows an ingot manufacturing apparatus according to a first embodiment of the present invention.

FIG. 1 shows an ingot manufacturing apparatus according to a first embodiment of the present invention. As shown in FIG. 1, the ingot manufacturing apparatus according to the first embodiment of the present invention includes an inner wall 110, a crucible 120, and a heat reflector 130. The ingot manufacturing apparatus according to the first embodiment of the present invention may use Continuous Czochralski method (hereafter, referred to as CCz method) capable of intermittently or continuously supplying silicon during the growth of an ingot IG.

The inner wall 110 has a growth zone (GZ) where the ingot IG grows from molten silicon (MS).

The crucible 120 surrounds the inner wall 110. The crucible 120 includes a melting zone (MZ) where the molten silicon (MS) is formed by the melting of the silicon. Here, the melting zone (MZ) may be a zone between the crucible 120 and the inner wall 110.

The molten silicon (MS) formed in the melting zone (MZ) may be introduced into the growth zone (GZ). An inlet hole H may be formed in the inner wall 110. The molten silicon (MS) may be introduced from the melting zone (MZ) to the growth zone (GZ) through the inlet hole H.

The heat reflector 130 is formed convexly toward an interface between the surface of the molten silicon (MS) of the growth zone (GZ) and the inner wall 110.

Next, an icing phenomenon which may occur during the growth of the ingot IG will be described with reference to FIGS. 2 and 3.

Figure 2:
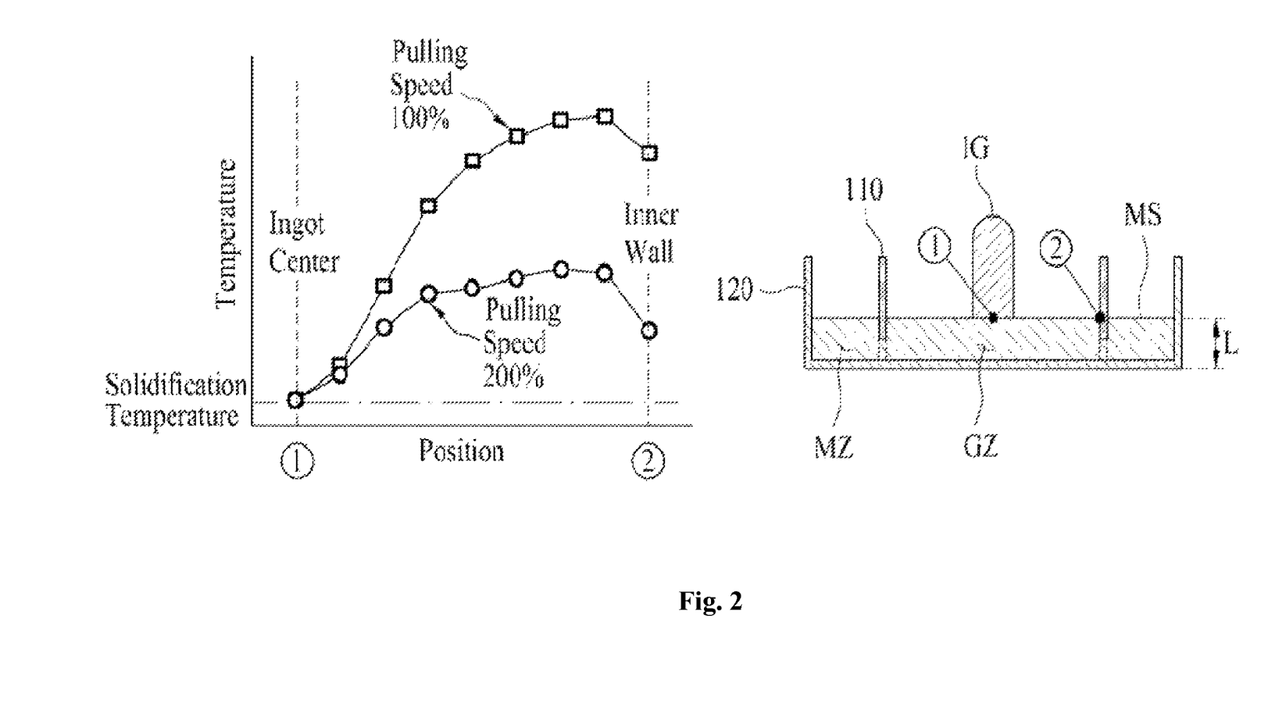
FIGS. 2 and 3 show surface temperature distributions of a growth zone by simulation.
Figure 3:
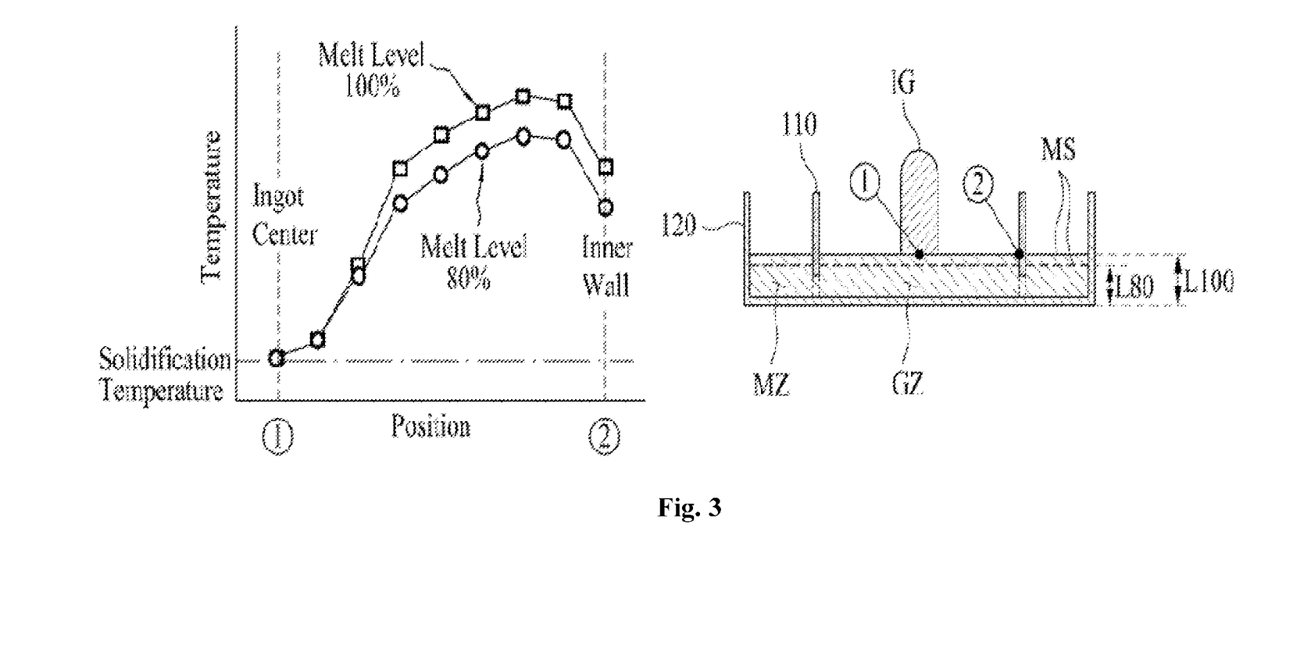

FIGS. 2 and 3 show surface temperature distributions of the growth zone (GZ) by simulation.

The graph of FIG. 2 shows the temperature distribution when the growth rate of the ingot IG varies under the same conditions (e.g., the height L of the molten silicon (MS), the length of the ingot IG, the supply rate of the silicon, etc.).

The temperature falls in the inner wall 110 because heat comes out from the inner wall 110. Here, with the increase of the growth rate of the ingot IG, the productivity of the ingot IG is increased, however, the temperature of the inner wall 110 falls, thereby increasing the possibility of occurrence of the icing phenomenon in which the molten silicon (MS) in contact with the inside of the inner wall 110 is solidified. As a result, the ingot IG may be difficult to be manufactured.

The graph of FIG. 3 shows the temperature distribution when the height L of the molten silicon (MS) changes under the same conditions (e.g., the length of the ingot IG, the growth rate of the ingot IG, the supply rate of the silicon, etc.).

The Melt Level of FIG. 3 may correspond to the height of the molten silicon (MS). Melt Level 100% may correspond to the initial height of the molten silicon (MS), and Melt Level 80% may correspond to 80% of the initial height of the molten silicon (MS). Here, the initial height may correspond to the height of the molten silicon (MS) at the time when the ingot IG begins to grow.

In FIG. 3, L100 corresponds to Melt Level 100%, and L80 corresponds to Melt Level 80%.

When the height of the molten silicon (MS) is reduced from L100 to L80, the temperature of the inside of the inner wall 110 falls, so that the possibility of the occurrence of the icing phenomenon increases. As a result, the ingot IG may be difficult to be manufactured.

As such, since the icing phenomenon may occur at the interface between the inner wall 110 and the molten silicon (MS), the ingot manufacturing apparatus according to the first embodiment of the present invention is able to prevent the icing by reflecting the heat of the molten silicon (MS) toward the interface through the heat reflector 130.

Figure 4:
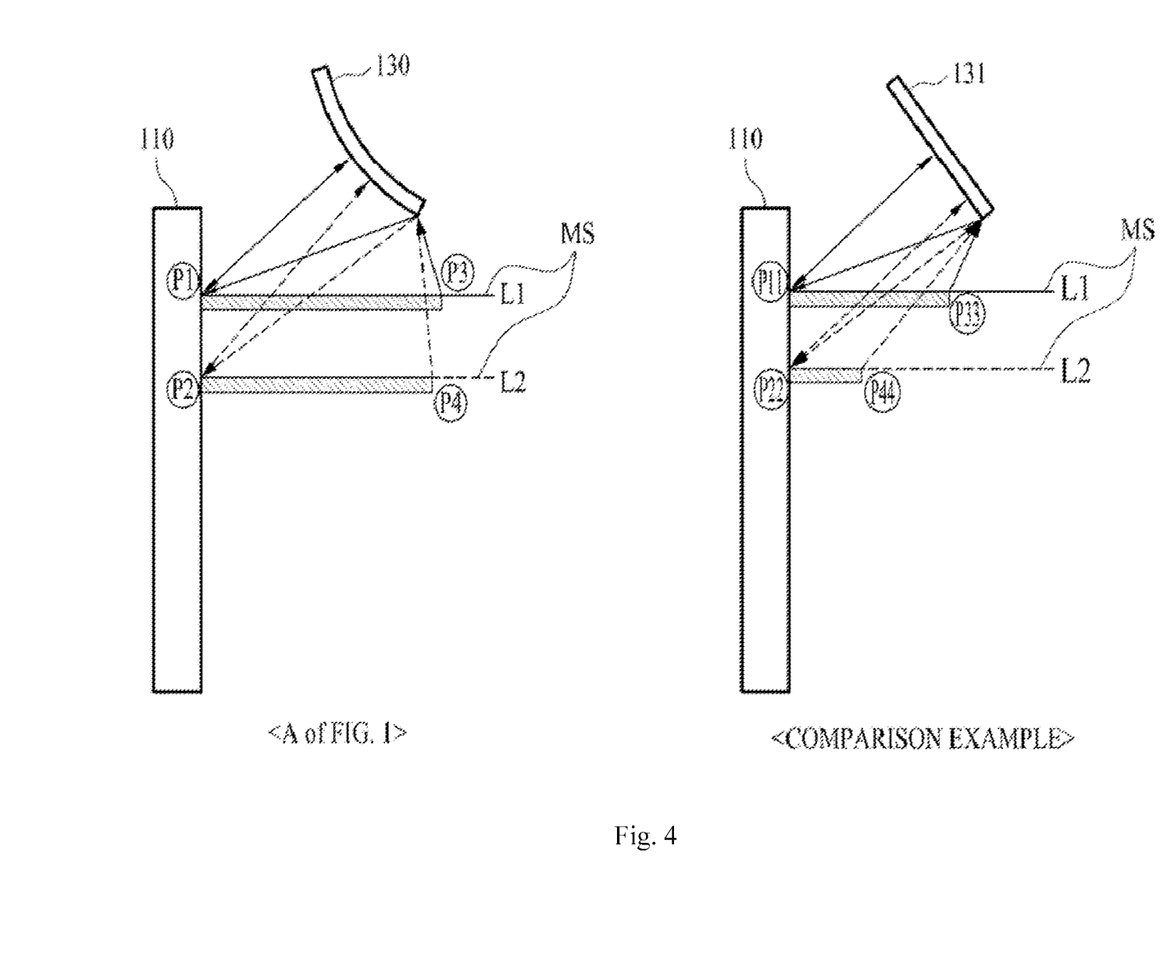
FIG. 4 shows a heat reflector of the ingot manufacturing apparatus according to the first embodiment of the present invention and a comparison example.

FIG. 4 shows the heat reflector 130 of the ingot manufacturing apparatus according to the first embodiment of the present invention and a comparison example. The heat reflector 130 of the ingot manufacturing apparatus according to the first embodiment of the present invention has a convex shape. A heat reflector 131 of the comparison example has a flat shape.

In FIG. 4, a first level L1 and a second level L2 represent the height of the molten silicon (MS).

P1 and P11 represent a first interface where the molten silicon (MS) having a height of the first level L1 contacts with the inner wall 110. P2 and P22 represent a second interface where the molten silicon (MS) having a height of the second level L2 contacts with the inner wall 110.

Also, P3 and P33 may represent a point of the molten silicon (MS) having the first level L1, which radiates the heat which is reflected from one end of the heat reflectors 130 and 131 and goes to the first interface.

P4 and P44 may represent a point of the molten silicon (MS) having the second level L2, which radiates the heat which is reflected from one end of the heat reflectors 130 and 131 and goes to the second interface.

As shown in FIG. 4, the heat reflector 130 of the ingot manufacturing apparatus according to the first embodiment of the present invention is able to reflect the heat of a relatively wider area toward the interface than the heat of the area of the comparison example.

That is, the heat reflector 130 of the ingot manufacturing apparatus according to the first embodiment of the present invention is able to reflect toward the first interface P1 the heat of the area between the P1 and P3 of the molten silicon (MS) having the first level L1. The heat reflector 131 of the comparison example is able to reflect toward the first interface P11 the heat of the area between the P11 and P33 of the molten silicon (MS) having the first level L1.

Also, the heat reflector 130 of the ingot manufacturing apparatus according to the first embodiment of the present invention is able to reflect toward the second interface P2 the heat of the area between the P2 and P4 of the molten silicon (MS) having the second level L2. The heat reflector 131 of the comparison example is able to reflect toward the second interface P22 the heat of the area between the P22 and P44 of the molten silicon (MS) having the second level L2.

Here, the area between the P1 and P3 of the molten silicon (MS) is greater than the area between the P11 and P33 of the molten silicon (MS), and the area between the P2 and P4 of the molten silicon (MS) is greater than the area between the P22 and P44 of the molten silicon (MS).

Since the heat reflector 130 of the ingot manufacturing apparatus according to the first embodiment of the present invention has a convex shape, the heat reflector 130 is able to reflect the heat of a wider area toward the first interface P1 and the second interface P2 than the heat reflector 131 having a flat shape of the comparison example. As a result, the heat reflector 130 of the ingot manufacturing apparatus according to the first embodiment of the present invention is able to prevent more effectively the icing phenomenon than the heat reflector 131 of the comparison example.

The heat reflector 130 having a convex shape changes the reflecting areas P1 to P3 and P2 to P4 to a lower degree in accordance with the height of the molten silicon (MS) than the heat reflector 131 of the comparison example, thereby maintaining relatively the reflecting areas well.

Meanwhile, as shown in FIG. 1, the ingot manufacturing apparatus according to the first embodiment of the present invention may further include a heat shield 140 and a cone 150.

The heat shield 140 may be disposed over the crucible 120. The cone 150 may be continuously formed with the heat shield 140 and disposed between the ingot IG and the inner wall 110. The heat shield 140 and the cone 150 may improve thermal efficiency by insulating the heat which is radiated from the molten silicon (MS) and protect the inner wall of a chamber 160 from high temperature radiant heat.

The heat reflector 130 may be disposed on the cone 150 disposed between the ingot IG and the inner wall 110. Thus, the heat reflector 130 is able to reflect the heat of the molten silicon (MS) toward the interface between the inner wall 110 and the molten silicon (MS) of the growth zone GZ.

Here, the heat shield 140 and the cone 150 may form a flow path of sweeping gas. As the crucible 120 and the inner wall 110 contact with the high temperature molten silicon (MS), oxygen may be generated from the crucible 120 and the inner wall 110.

The oxygen is combined with the silicon, and then silicon oxide is formed. If the silicon oxide contacts with the growing ingot IG, the growth of the ingot IG may be interrupted by the silicon oxide.

Since the silicon oxide is distributed on the surface of the molten silicon (MS), the heat shield 140 and the cone 150 may form a flow path that allows the sweeping gas introduced from the outside of the chamber 160 to pass the surface of the molten silicon (MS) in the growth zone GZ.

When the cone 150 is equipped with the heat reflector 130, it is possible to prevent the icing phenomenon that may occur at the interface between the inner wall 110 and the molten silicon (MS), and possible to remove the silicon oxide caused by the sweeping gas.

The sweeping gas may move to an outlet 170 through the flow path formed by the heat shield 140 and the cone 150. The outlet 170 may discharge the sweeping gas to the outside of the chamber 160. Here, the outlet 170 may be disposed on the side of the chamber 160, and unlike FIG. 1, may be disposed on the bottom of the chamber 160

Figure 5:
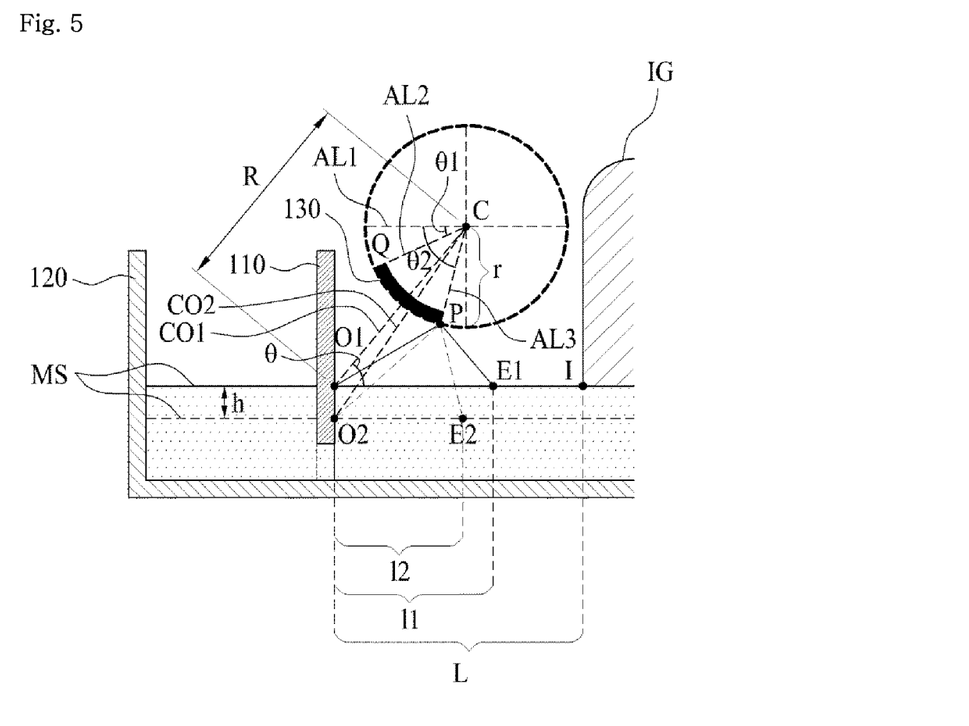
FIG. 5 shows a design condition of the heat reflector of the ingot manufacturing apparatus according to the first embodiment of the present invention.

FIG. 5 shows a design condition of the heat reflector of the ingot manufacturing apparatus according to the first embodiment of the present invention.

In FIG. 5, C may correspond to the center of a circle having the radius of curvature of the heat reflector 130. O1 may correspond to an interface between the inner wall 110 and the molten silicon (MS) having the initial height in the growth zone GZ. O2 may correspond to an interface between the inner wall 110 and the molten silicon (MS) having a height less than the initial height in the growth zone GZ. Here, the initial height may correspond to the height of the molten silicon (MS) at the time when the ingot IG begins to grow.

P may correspond to a first end of the heat reflector 130. Q may correspond to a second end of the heat reflector 130, which is closer to the inner wall 110 than the first end. E1 may correspond to a maximum point where reflected heat can reach the O1 from the molten silicon (MS) having the initial height. E2 may correspond to a maximum point where the reflected heat can reach the O2 from the molten silicon (MS) having a height less than the initial height. I may correspond to a point where the ingot IG and the molten silicon (MS) contact with each other.

R may correspond to a distance between O1 and C. r may correspond to the radius of curvature of the heat reflector 130. L may correspond to a distance between the outside of the ingot IG and the inside of the inner wall 110, that is to say, a distance between O1 and I. l1 may correspond to a maximum distance capable of heating O1 from the molten silicon (MS) having an initial height. l2 may correspond to a maximum distance capable of heating O2 from the molten silicon (MS) having a height less than the initial height.

As shown in FIG. 5, imaginary lines CO1 and CO2 formed by connecting the center C of the radius of curvature of the heat reflector 130 to the interfaces O1 and O2 respectively may pass through the heat reflector 130. As a result, the heat reflector 130 formed convexly toward the interfaces O1 and O2 is able to reflect the heat toward the interfaces O1 and O2.

Here, the radius of curvature r may be smaller than the distance between the interfaces O1 and O2 and the center C. Unlike this, when the radius of curvature r is equal to or greater than the distance between the interfaces O1 and O2 and the center C, the heat reflector 130 contacts with the inner wall 110, so that the heat reflector 130 may be difficult to be installed.

As described above, the heat reflector 130 may have the first end P and the second end Q closer to the inner wall 110 than the first end P. Here, when the imaginary line CO1 connects the center with the interface between the inner wall 110 and the surface of the molten silicon (MS) having the initial height, an angle θ formed between the imaginary line CO1 and the surface of the molten silicon (MS) may be the same as or greater than an angle θ1 formed between a first imaginary auxiliary line AL1 which passes through the center C and is parallel with the molten silicon (MS) and a second imaginary auxiliary line AL2 which passes through the center C and the second end Q. If θ is less than θ1, the heat reflector 130 may not reflect the heat radiated from the interface θ1 toward the interface θ1.

Further, the angle θ formed between the imaginary line CO1 and the surface of the molten silicon (MS) may be less than an angle θ2 formed between the first imaginary auxiliary line AL1 and a third imaginary auxiliary line AL3 which passes through the center C and the first end P. As such, only when θ2 is greater than θ, the heat reflector 130 is able to reflect toward the interface O1 the heat of the molten silicon (MS) within a range from the interface O1 to the maximum point E1.

Here, θ2 may be the same as or less than π/2. Contrary to this, if θ2 is greater than π/2, the heat is reflected toward the ingot IG, so that the growth of the ingot IG may be interrupted.

Meanwhile, when it is set that the coordinates of O1 is (0,0), the coordinates of O2 is (0, −h), the coordinates of P is (Px,Py), the coordinates of E1 is (l1,0), the coordinates of E2 is (l2, −h), and the coordinates of I is (L,0), Px may be R cos θ−r cos θ2, and Py may be R sin θ−r sin θ2.

Here, when B is assumed to be Py/Px, l1 may be the following equation (1).

$$l1 = Px + Py[\{1 + B \tan(2\theta 2)\}/\{B - \tan(2\theta 2)\}]$$ equation (1).

Therefore, when it is assumed that B'=(Py+h)/Px, l2 may be the following equation (2).

$$l2 = Px + (Py + h)[\{1 + B' \tan(2\theta 2)\}/\{B' - \tan(2\theta 2)\}]$$ equation (2)

As can be seen through FIG. 5, Px is less than L. When Px is greater than L to the contrary, not only O1 receives the heat but also the ingot IG also becomes to receive the reflected heat, so that the growth of the ingot IG may be interrupted.

In the meantime, the surface of the heat reflector 130 may be made of one of SiC, SiN, SiCN, SiBN, SicBN, ZrC, ZrN, ZrCN, ZrBN, ZrcBN, TiC, TiN, TiCN, TiBN, TicBN, tungsten carbide, molybdenum, tungsten, tantalum, or chrome.

For example, the heat reflector 130 may be formed by coating graphite with one of SiC, SiN, SiCN, SiBN, SicBN, ZrC, ZrN, ZrCN, ZrBN, ZrcBN, TiC, TiN, TiCN, TiBN, TicBN.

The heat reflector 130 may be made of one of SiC, SiN, SiCN, SiBN, SicBN, ZrC, ZrN, ZrCN, ZrBN, ZrcBN, TiC, TiN, TiCN, TiBN, TicBN or tungsten carbide.

The heat reflector 130 may be made of molybdenum, tungsten, and tantalum.

The heat reflector 130 may be formed by coating the surface of glass or quartz with chrome.

Next, an ingot manufacturing apparatus according to a second embodiment of the present invention will be described with reference to the drawings.

Figure 6:
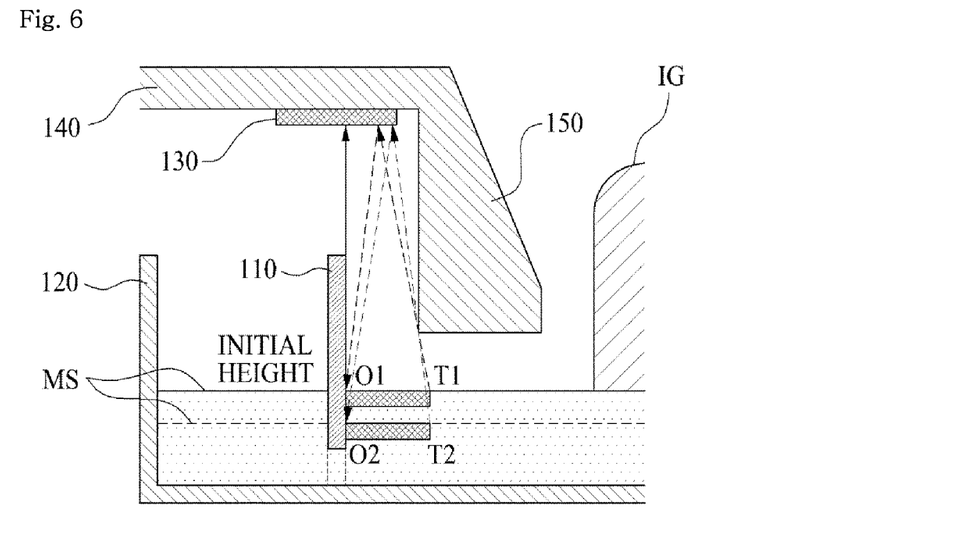
FIG. 6 shows an ingot manufacturing apparatus according to a second embodiment of the present invention.

FIG. 6 shows the ingot manufacturing apparatus according to the second embodiment of the present invention. The ingot manufacturing apparatus according to the second embodiment of the present invention includes the inner wall 110, the crucible 120, the heat shield 140, and the heat reflector 130. Since the inner wall 110, the crucible 120, and the heat shield 140 have been described in the first embodiment, detailed descriptions thereof will be omitted.

As shown in FIG. 6, the heat reflector 130 is disposed beneath the bottom surface of the heat shield 140 parallel with the surface of the molten silicon (MS). Here, the reflective surface of the heat reflector 130 may be flat.

Because the reflected heat received by the interfaces O1 and O2 is changed to a small extent in accordance with the height of the molten silicon (MS), the heat reflector 130 makes it easier to maintain a temperature condition for preventing the icing from occurring.

The ingot manufacturing apparatus according to the second embodiment of the present invention may further include the cone 150. The cone 150 may be continuously formed with the heat shield 140 and may have an end located between the ingot IG and the inner wall 110.

The area of the molten silicon (MS), which is capable of radiating the heat to the heat reflector 130, may be limited by the cone 150. For example, the heat reflector 130 is able to reflect toward the interface O1 the heat radiated from the area between O1 and T1 of the molten silicon (MS) having the initial height.

Also, the heat reflector 130 is able to reflect toward the interface O2 the heat radiated from the area between O2 and T2 of the molten silicon (MS) having a height less than initial height.

As such, since the area of the molten silicon (MS), which is capable of radiating the heat to the heat reflector 130, is limited by the cone 150, the heat reflected by the heat reflector 130 may be concentrated on the molten silicon (MS) in the vicinity of the inner wall. As a result, the heat reflected by the heat reflector 130 is difficult to reach the ingot IG, so that the ingot IG can stably grow.

Figure 7:
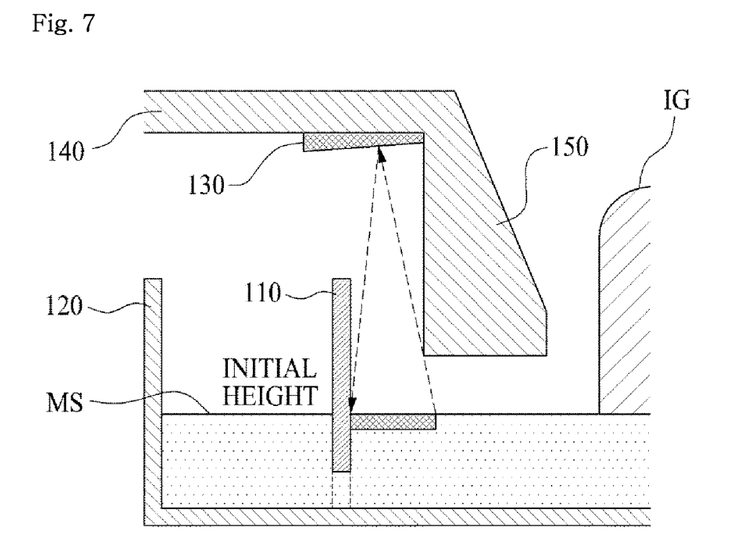
FIGS. 7 and 8 show a modified example of the ingot manufacturing apparatus according to the second embodiment of the present invention.
Figure 8:
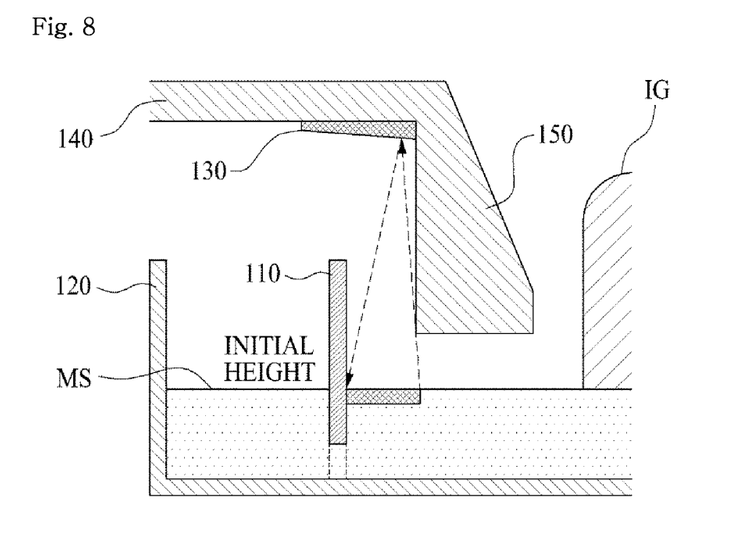

FIGS. 7 and 8 show a modified example of the ingot manufacturing apparatus according to the second embodiment of the present invention.

As shown in FIGS. 7 and 8, the thickness of the heat reflector 130 may be increased or decreased toward the ingot IG. As described above, the area of the molten silicon (MS), which is capable of radiating the heat to the heat reflector 130, may be limited by the cone 150.

The heat reflector 130 of FIG. 7 can be applied to increase the limited area. The heat reflector 130 of FIG. 8 can be applied to reduce the limited area. As such, it is possible to variously set the limited area.

The surface of the heat reflector 130 may be made of one of SiC, SiN, SiCN, SiBN, SicBN, ZrC, ZrN, ZrCN, ZrBN, ZrcBN, TiC, TiN, TiCN, TiBN, TicBN, tungsten carbide, molybdenum, tungsten, tantalum, or chrome.

For example, the heat reflector 130 may be formed by coating graphite with one of SiC, SiN, SiCN, SiBN, SicBN, ZrC, ZrN, ZrCN, ZrBN, ZrcBN, TiC, TiN, TiCN, TiBN, TicBN.

The heat reflector 130 may be made of one of SiC, SiN, SiCN, SiBN, SicBN, ZrC, ZrN, ZrCN, ZrBN, ZrcBN, TiC, TiN, TiCN, TiBN, TicBN or tungsten carbide.

The heat reflector 130 may be made of molybdenum, tungsten, and tantalum.

The heat reflector 130 may be formed by coating the surface of glass or quartz with chrome.

Next, an ingot manufacturing apparatus according to a third embodiment of the present invention will be described with reference to the drawings.

Figure 9:
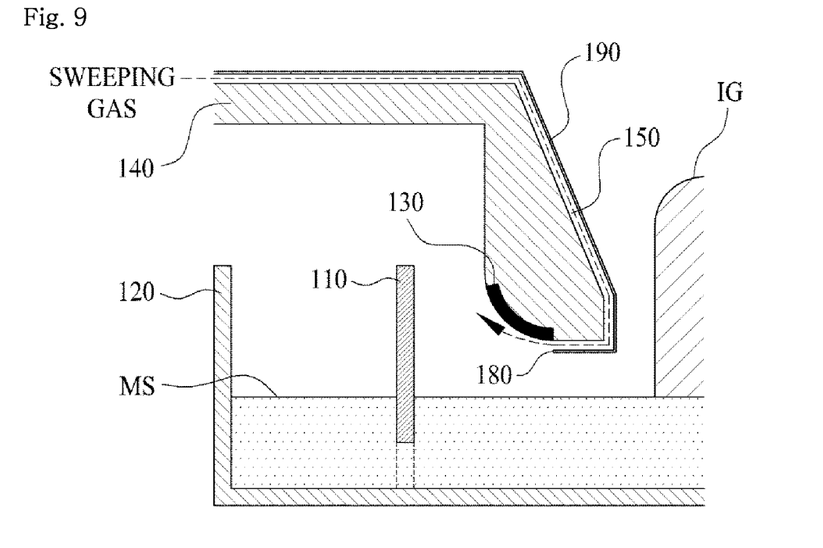
FIGS. 9 and 11 show an ingot manufacturing apparatus according to a third embodiment of the present invention.
Figure 10:
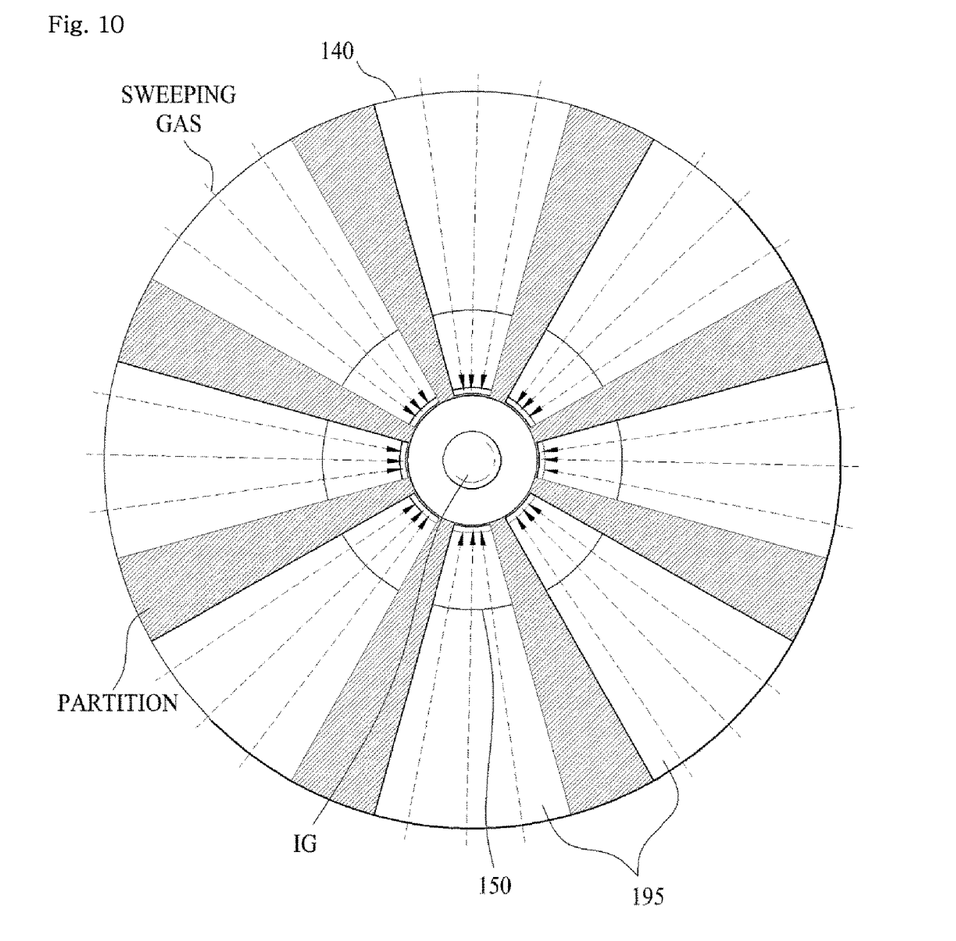
FIG. 10 shows a flow path of the ingot manufacturing apparatus of FIG. 9.

FIGS. 9 and 10 show the ingot manufacturing apparatus according to the third embodiment of the present invention. As shown in FIGS. 9 and 10, the ingot manufacturing apparatus according to the third embodiment of the present invention includes the inner wall 110, the crucible 120, the heat reflector 130, and a gas nozzle 180.

Since the inner wall 110, the crucible 120, and the heat reflector 130 have been described in the first embodiment and the second embodiment, detailed descriptions thereof will be omitted.

The gas nozzle 180 sprays the sweeping gas toward the surface of the heat reflector 130. As described above, the silicon oxide may be produced during the manufacturing process of the ingot IG. The silicon oxide may be attached to the heat reflector 130. The silicon oxide attached to the heat reflector 130 may deteriorate the heat reflection efficiency of the heat reflector 130.

The gas nozzle 180 sprays the sweeping gas toward the surface of the heat reflector 130, thereby removing the silicon oxide attached to the surface of the heat reflector 130 or preventing the silicon oxide from being attached to the surface of the heat reflector 130.

As shown in FIG. 9, the ingot manufacturing apparatus according to the third embodiment of the present invention may further include the heat shield 140 which is disposed over the inner wall 110, and the cone 150 which is continuously formed with the heat shield 140 and disposed between the ingot IG and the inner wall 110.

Here, the heat reflector 130 may be formed convexly toward the interface between the inner wall 110 and the surface of the molten silicon (MS) of the growth zone GZ. The gas nozzle 180 may spray the sweeping gas moving through a flow path 190 formed within the cone 150.

Although FIG. 1 shows that the flow path 190 communicates with the outside of the chamber 160 through the side of the chamber 160, there is no limit to this. The sweeping gas flowing through the flow path 190 may be introduced from the top or bottom of the chamber 160.

FIG. 10 shows the flow path of the ingot manufacturing apparatus of FIG. 9. FIG. 10 is a top cross sectional view of the ingot manufacturing apparatus of FIG. 9. As shown in FIG. 10, the flow path 190 is divided into a plurality of sub flow paths 195 by partitions. The plurality of the sub flow paths 195 may have substantially the same area as each other. Since the flow path 190 is equally divided into the sub flow paths 195, the sweeping gas may be evenly sprayed with respect to the entire heat reflector 130.

Figure 11:
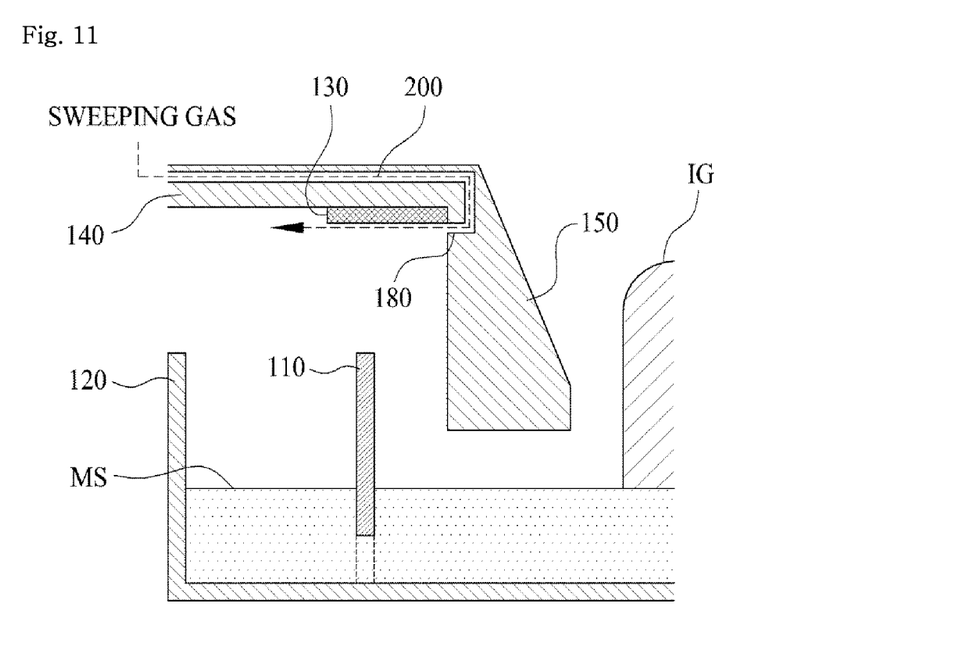

Meanwhile, as shown in FIG. 11, the ingot manufacturing apparatus according to the third embodiment of the present invention may further include the heat shield 140 which is disposed over the inner wall 110, and the cone 150 which is continuously formed with the heat shield 140 and disposed between the ingot IG and the inner wall 110. Here, heat reflector 130 may be disposed beneath the bottom surface of the heat shield 140 parallel with the surface of the molten silicon (MS). The gas nozzle 180 may spray the sweeping gas moving through a flow path 200 formed within the heat shield 140.

Although the flow path 200 of FIG. 11 is not shown in FIG. 1, the flow path 200 may communicate with the outside of the chamber 160 through the side, top or bottom of the chamber 160.

Figure 12:
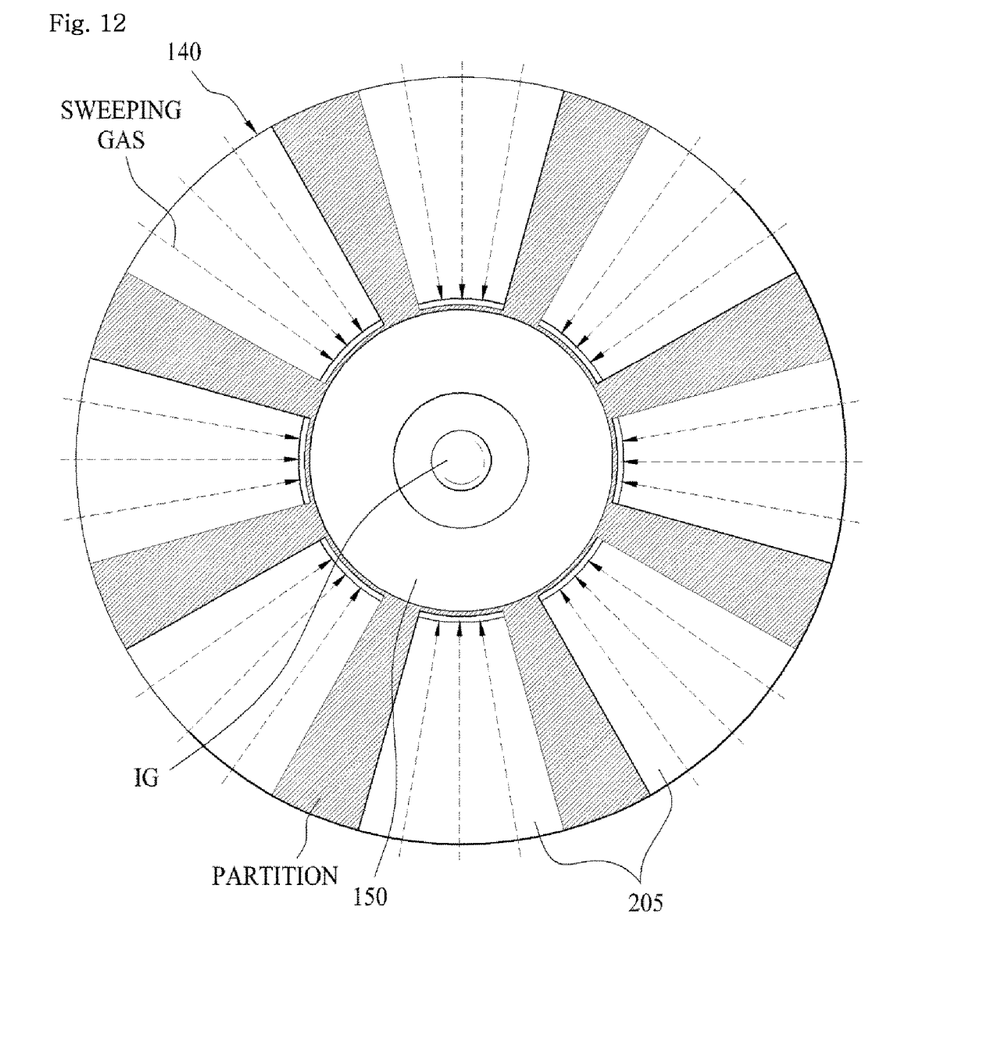
FIG. 12 shows a flow path of the ingot manufacturing apparatus of FIG. 10.

As shown in FIG. 12, the flow path 200 is divided into a plurality of sub flow paths 205 by partitions. The plurality of the sub flow paths 205 may have substantially the same area as each other. Since the flow path 200 is equally divided into the sub flow paths 205, the sweeping gas may be evenly sprayed with respect to the entire heat reflector 130.

Meanwhile, a feeding part 210 of FIG. 1 supplies the silicon for the crucible 120 during the growth of the ingot IG such that the height of the molten silicon (MS) changes. The feeding part 210 may have a pipe shape or a tubular shape. However there is no limit to the shape of the feeding part 210.

A susceptor 220 may surround the outside of the crucible 120. Since the silicon is melted at a high temperature, the crucible 120 may be softened. The susceptor 220 may function to support the maintenance of the shape of the crucible 120.

A heater 230 heats the crucible 120 for the purpose of forming the molten silicon (MS). That is, the heater 230 heats the crucible 120 in order to melt the silicon supplied through the feeding part 210. The heater 230 may be installed adjacent to the susceptor 220. The heater 230 is able to heat the silicon to about 1,420 degrees Celsius, that is to say, the melting temperature of the silicon. Accordingly, the silicon can be melted in the crucible 120.

A shaft 240 is connected to the susceptor 220 and supports the crucible 120. When the susceptor 220 is not provided, the shaft 240 may be directly connected to the crucible 120.

Until now, the embodiments of the present invention have been and described. It is understood by those skilled in the art that the embodiments can be variously modified without departing from the spirit and scope of the present invention. Therefore, the embodiment should not be limited and should be construed as an example. Accordingly, the present invention is not limited to the above-description and is changeable within the scope of the appended claims as well as all equivalents thereto.

What is claimed is:

1. An ingot manufacturing apparatus comprising:
   an inner wall including a growth zone where an ingot grows from molten silicon;
   a crucible surrounding the inner wall;
   a heat shield disposed over the inner wall;
   a cone extending from a side of the heat shield toward the molten silicon and having a convex part that face an interface between a surface of the molten silicon of the growth zone and the inner wall;
   a heat reflector attached to the convex part of the cone; and
   a gas nozzle disposed along a side of the heat shield and the cone, wherein the gas nozzle sprays sweeping gas along a surface of the heat reflector.

2. The ingot manufacturing apparatus of claim 1, wherein an imaginary line formed by connecting a center of a radius of the curvature of the heat reflector to the interface passes through the heat reflector.

3. The ingot manufacturing apparatus of claim 2, wherein the radius of the curvature is smaller than a distance between the interface and the center.

4. The ingot manufacturing apparatus of claim 2,
   wherein the heat reflector has a first end and a second end closer to the inner wall than the first end,
   wherein, when the imaginary line connects the center with the interface between the inner wall and the surface of the molten silicon having an initial height, an angle formed between the imaginary line and the surface of the molten silicon is the same as or greater than an angle formed between a first imaginary auxiliary line which passes through the center and is parallel with the molten silicon and a second imaginary auxiliary line which passes through the center and the second end, and
   wherein the angle formed between the imaginary line and the surface of the molten silicon is less than an angle formed between the first imaginary auxiliary line and a third imaginary auxiliary line which passes through the center and the first end.

5. The ingot manufacturing apparatus of claim 1, wherein a surface of the heat reflector is made of one of SiC, SiN, SiCN, SiBN, SicBN, ZrC, ZrN, ZrCN, ZrBN, ZrcBN, TiC, TiN, TiCN, TiBN, TicBN, tungsten carbide, molybdenum, tungsten, tantalum, or chrome.

6. An ingot manufacturing apparatus comprising:
   a chamber;
   an inner wall including a growth zone where an ingot grows from molten silicon in the chamber;
   a crucible surrounding the inner wall;
   a heat shield disposed over the inner wall, extending from a side of the chamber to the growth zone and arranged in parallel to a surface of the molten silicon;

a cone extending from a side of the heat shield toward the molten silicon and located between the ingot and the inner wall; and a heat reflector disposed on a bottom surface of the heat shield and facing the inner wall.

7. The ingot manufacturing apparatus of claim 6, wherein a thickness of the heat reflector is increased or decreased toward the ingot.

8. The ingot manufacturing apparatus of claim 6, wherein a surface of the heat reflector is made of one of SiC, SiN, SiCN, SiBN, SicBN, ZrC, ZrN, ZrCN, ZrBN, ZrcBN, TiC, TiN, TiCN, TiBN, TicBN, tungsten carbide, molybdenum, tungsten, tantalum, or chrome.

9. The ingot manufacturing apparatus of claim 6, wherein a reflective surface of the heat reflector is flat.

* * * * *